US012075599B2

(12) United States Patent
Lin et al.

(10) Patent No.: US 12,075,599 B2
(45) Date of Patent: Aug. 27, 2024

(54) ELECTRONIC APPARATUS, IMMERSION COOLING SYSTEM AND LIQUID AMOUNT ADJUSTING MODULE

(71) Applicant: Wiwynn Corporation, New Taipei (TW)

(72) Inventors: Chun-Wei Lin, New Taipei (TW); Ting-Yu Pai, New Taipei (TW); Pai-Chieh Huang, New Taipei (TW); Chin-Han Chan, New Taipei (TW); Hsien-Chieh Hsieh, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 42 days.

(21) Appl. No.: 17/226,103

(22) Filed: Apr. 9, 2021

(65) Prior Publication Data
US 2022/0248558 A1    Aug. 4, 2022

(30) Foreign Application Priority Data

Feb. 2, 2021   (TW) .................................. 110103815

(51) Int. Cl.
*H05K 7/20*    (2006.01)
(52) U.S. Cl.
CPC ......... *H05K 7/203* (2013.01); *H05K 7/20318* (2013.01); *H05K 7/20327* (2013.01)
(58) Field of Classification Search
CPC ............... H05K 7/203; H05K 7/20318; H05K 7/20327; H05K 7/20381
USPC ....................................................... 361/700
See application file for complete search history.

(56) References Cited

U.S. PATENT DOCUMENTS

| 3,687,576 A | * | 8/1972 | Wikholm | F04D 29/607 |
| | | | | 417/423.15 |
| 4,704,658 A | * | 11/1987 | Yokouchi | H05K 7/203 |
| | | | | 361/698 |
| 5,293,754 A | * | 3/1994 | Mizuno | H01L 23/473 |
| | | | | 165/286 |

(Continued)

FOREIGN PATENT DOCUMENTS

| CN | 110290677 | 9/2019 |
| CN | 111434197 | 7/2020 |

(Continued)

OTHER PUBLICATIONS

Office Action of Taiwan Counterpart Application, issued on Dec. 14, 2021, pp. 1-18.

*Primary Examiner* — Anatoly Vortman
(74) *Attorney, Agent, or Firm* — JCIPRNET

(57) ABSTRACT

An electronic apparatus includes at least one heat generating component and an immersion cooling system. The immersion cooling system includes a main tank and a liquid amount adjusting module. The main tank is adapted to contain a heat dissipation medium, and the heat generating component is disposed in the main tank to be immersed in the heat dissipation medium. The liquid adjusting module includes an auxiliary tank and a pump. The auxiliary tank is adjacent to the main tank, and the heat dissipation medium in the main tank is adapted to be overflowed into the auxiliary tank. The pump is disposed in the auxiliary tank and adapted to drive the heat dissipation medium in the auxiliary tank to flow into the main tank.

23 Claims, 9 Drawing Sheets

(56) References Cited

U.S. PATENT DOCUMENTS

| | | | | |
|---|---|---|---|---|
| 5,731,954 | A * | 3/1998 | Cheon | G06F 1/20 |
| | | | | 174/15.1 |
| 6,234,240 | B1 * | 5/2001 | Cheon | G06F 1/20 |
| | | | | 165/185 |
| 8,899,558 | B2 * | 12/2014 | Choi | G01F 23/26 |
| | | | | 261/119.1 |
| 10,143,113 | B2 * | 11/2018 | Shelnutt | H05K 7/203 |
| 10,390,458 | B2 | 8/2019 | Tufty et al. | |
| 10,416,736 | B2 * | 9/2019 | Dupont | H05K 7/20936 |
| 10,477,726 | B1 * | 11/2019 | Enright | H05K 7/203 |
| 10,645,841 | B1 * | 5/2020 | Mao | H05K 7/20 |
| 10,881,020 | B1 | 12/2020 | Liu et al. | |
| 11,375,638 | B2 * | 6/2022 | Cheng | H05K 7/20318 |
| 2015/0062806 | A1 * | 3/2015 | Shelnutt | H05K 7/20318 |
| | | | | 361/679.53 |
| 2015/0070846 | A1 * | 3/2015 | Shelnutt | H05K 7/20809 |
| | | | | 361/699 |
| 2017/0265336 | A1 * | 9/2017 | Ichinose | H05K 7/20772 |
| 2017/0290205 | A1 * | 10/2017 | Shepard | H05K 7/20936 |
| 2019/0090383 | A1 | 3/2019 | Tufty et al. | |
| 2020/0305310 | A1 * | 9/2020 | Alissa | H05K 7/203 |
| 2020/0393206 | A1 | 12/2020 | Liu et al. | |

FOREIGN PATENT DOCUMENTS

| | | |
|---|---|---|
| TW | 202020385 | 6/2020 |
| TW | I710883 | 11/2020 |
| WO | 2020061305 | 3/2020 |

* cited by examiner

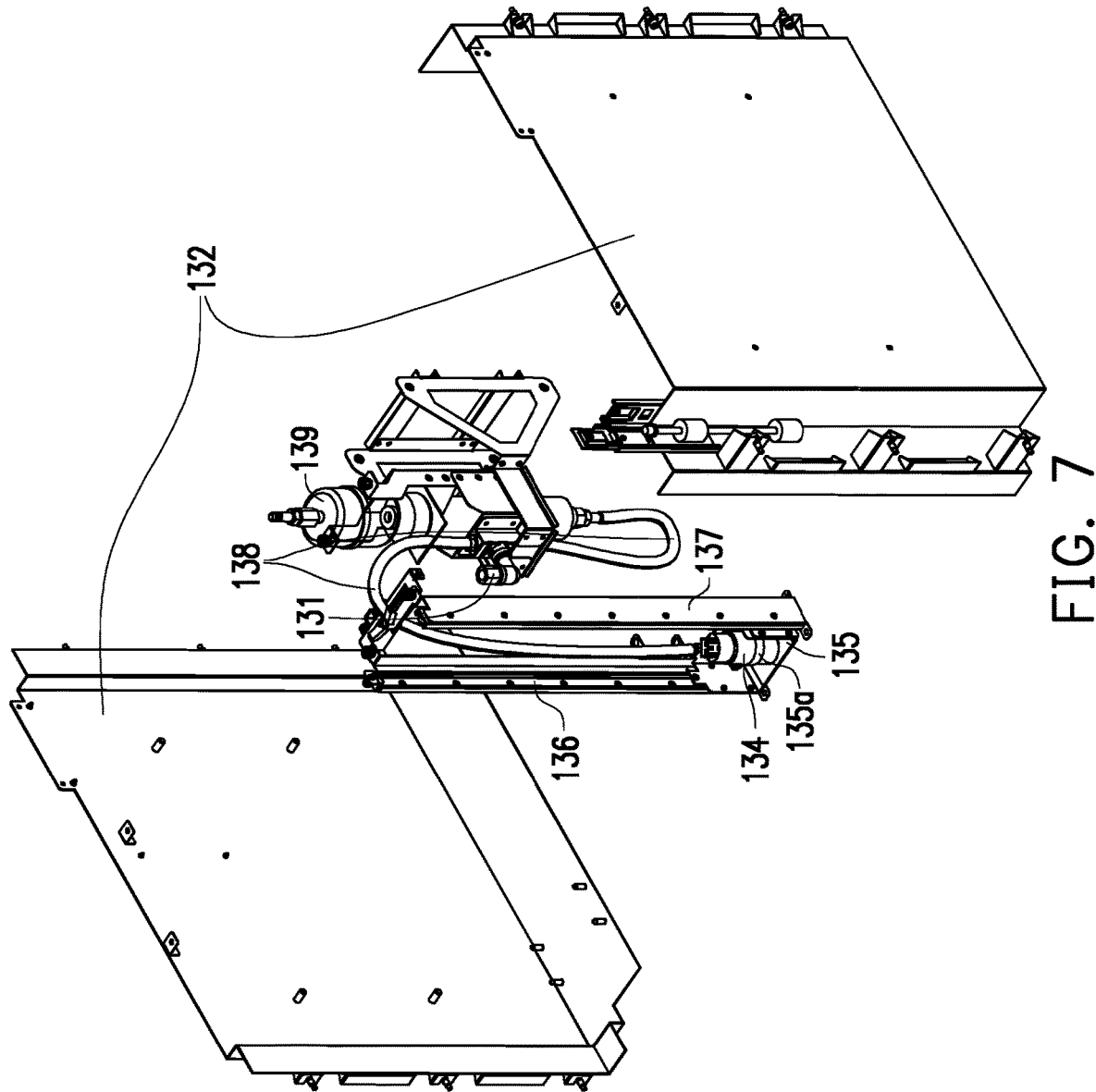

ELECTRONIC APPARATUS, IMMERSION COOLING SYSTEM AND LIQUID AMOUNT ADJUSTING MODULE

CROSS-REFERENCE TO RELATED APPLICATION

This application claims the priority benefit of Taiwan application serial no. 110103815, filed on Feb. 2, 2021. The entirety of the above-mentioned patent application is hereby incorporated by reference herein and made a part of this specification.

TECHNICAL FIELD

The disclosure relates to a cooling system, an adjusting module, and an electronic apparatus having the same, and more particularly to an immersion cooling system, a liquid amount adjusting module, and an electronic apparatus having the same.

BACKGROUND

With the rapid development of server performance, high-performance servers generate a lot of waste heat. In order to avoid the accumulation of waste heat causing poor operation of the host, some servers are designed to immerse the motherboard in heat dissipation liquid, which absorbs the heat generated by the heat generating elements of the motherboard and vaporizes and condenses on condensation pipelines. Droplets of the heat dissipation liquid on the condensation pipelines fall back into the heat dissipation liquid by gravity, achieving the effect of heat dissipation with this circulation, which is called two-phase immersion cooling technology in the industry. Factors such as thermal expansion or contraction of the heat dissipation liquid, diffusion of the heat dissipation liquid, and/or placement or removal of the motherboard all cause the liquid level of the heat dissipation liquid to be too low or too high. The liquid level being too low makes the motherboard unable to be completely immersed in the heat dissipation liquid and thereby reduces the heat dissipation effect, while the liquid level being too high reduces the visibility of status lights of the motherboard.

SUMMARY

The disclosure provides an electronic apparatus, an immersion cooling system, and a liquid amount adjusting module, capable of stably controlling the liquid level of a heat dissipation medium.

The electronic apparatus of the disclosure includes at least one heat generating component and an immersion cooling system. The immersion cooling system includes a main tank and a liquid amount adjusting module. The main tank is adapted to contain a heat dissipation medium, and the heat generating component is disposed in the main tank to be immersed in the heat dissipation medium. The liquid amount adjusting module includes an auxiliary tank and a pump. The auxiliary tank is adjacent to the main tank, and the heat dissipation medium in the main tank is adapted to be overflowed into the auxiliary tank. The pump is disposed in the auxiliary tank and adapted to drive the heat dissipation medium in the auxiliary tank to flow into the main tank.

The immersion cooling system of the disclosure includes a main tank and a liquid amount adjusting module. The main tank is adapted to contain a heat dissipation medium, and at least one heat generating component is disposed in the main tank to be immersed in the heat dissipation medium. The liquid amount adjusting module includes an auxiliary tank and a pump. The auxiliary tank is adjacent to the main tank, and the heat dissipation medium in the main tank is adapted to be overflowed into the auxiliary tank. The pump is disposed in the auxiliary tank and adapted to drive the heat dissipation medium in the auxiliary tank to flow into the main tank.

The liquid level adjusting module of the disclosure is adapted for an immersion cooling system. The immersion cooling system includes a main tank, which is adapted to contain a heat dissipation medium, and the liquid level adjusting module includes an auxiliary tank and a pump. The auxiliary tank is adjacent to the main tank. The pump is disposed in the auxiliary tank. The pump drives the heat dissipation medium in the auxiliary tank to refill the main tank, in order to adjust the liquid level of the heat dissipation medium in the main tank.

In an embodiment of the disclosure, the capacity of the auxiliary tank is smaller than the capacity of the main tank.

In an embodiment of the disclosure, the capacity of the auxiliary tank is not smaller than the volume of the at least one heat generating component.

In an embodiment of the disclosure, the pump is disposed at the bottom in the auxiliary tank.

In an embodiment of the disclosure, the liquid amount adjusting module (liquid level adjusting module) includes a guide rail, which is disposed in the auxiliary tank, and the pump is connected to the guide rail and adapted to move along the guide rail toward the top of the auxiliary tank.

In an embodiment of the disclosure, the liquid amount adjusting module (liquid level adjusting module) includes a filter, which is connected to the pump, and the pump is adapted to drive the heat dissipation medium in the auxiliary tank to flow into the main tank through the filter.

In an embodiment of the disclosure, the liquid amount adjusting module (liquid level adjusting module) includes a pressure gauge, which is connected to the pump.

In an embodiment of the disclosure, the liquid amount adjusting module (liquid level adjusting module) includes a liquid level sensor, which is disposed at the auxiliary tank.

In an embodiment of the disclosure, the liquid amount adjusting module (liquid level adjusting module) includes a pipeline, which is connected to the pump and extended toward the main tank, and the pump drives the heat dissipation medium in the auxiliary tank to refill the main tank through the pipeline.

In an embodiment of the disclosure, the immersion cooling system includes a condensation structure, which is disposed above the main tank. The heat dissipation medium in a liquid state is adapted to vaporize into the heat dissipation medium in a gaseous state with the heat energy of the heat generating component. When flowing to the condensation structure, the heat dissipation medium in the gaseous state condenses into the heat dissipation medium in the liquid state on the condensation structure. The heat dissipation medium in the liquid state which condenses on the condensation structure falls back into the heat dissipation medium in the liquid state in the main tank by gravity.

BRIEF DESCRIPTION OF THE DRAWINGS

FIG. 7 is an exploded view of part of the components of the liquid amount adjusting module of FIG. 4.

DESCRIPTION OF THE EMBODIMENTS

Figure 1:
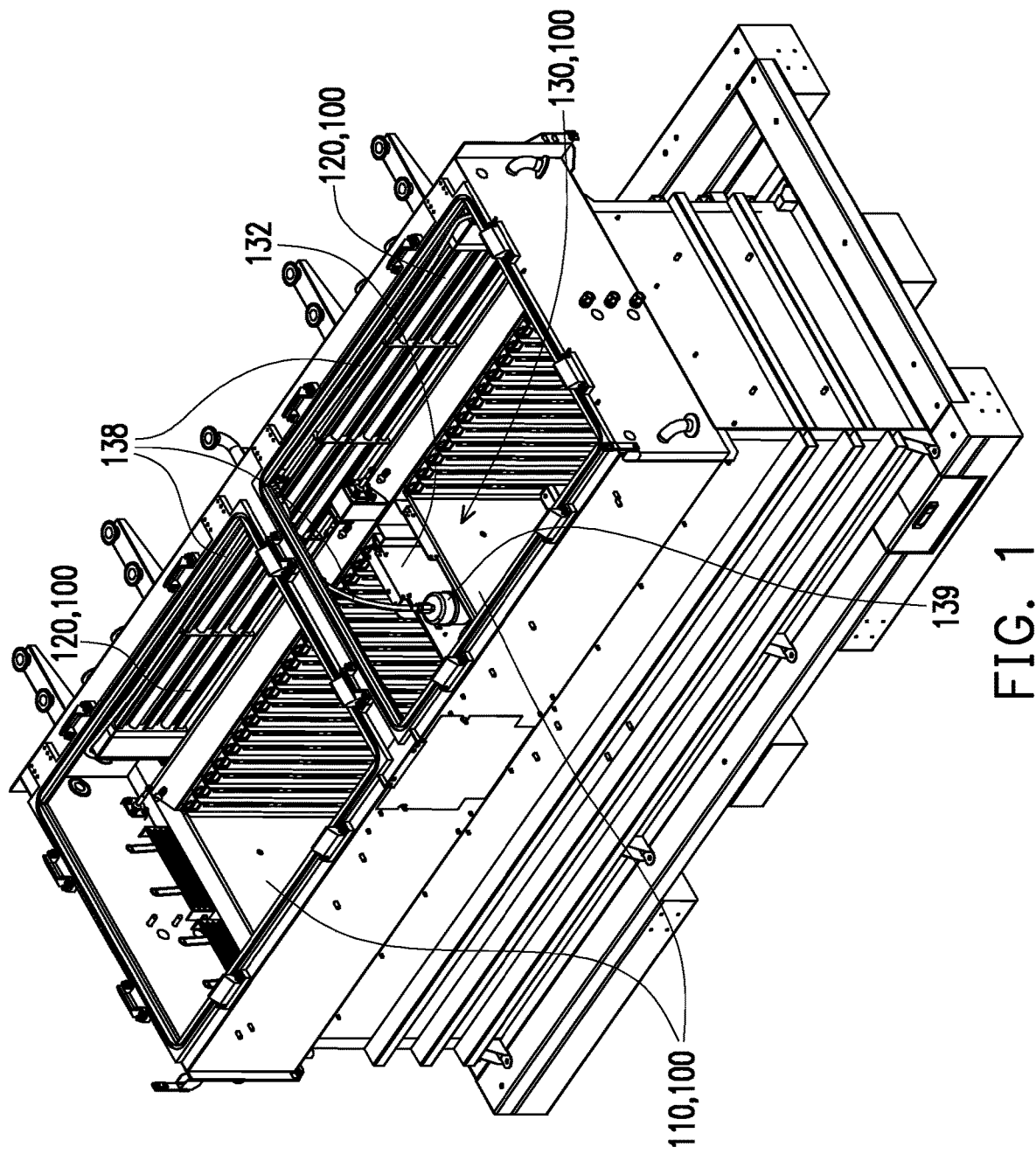
FIG. 1 is a perspective view of part of the components of an electronic apparatus according to an embodiment of the disclosure.
Figure 2:
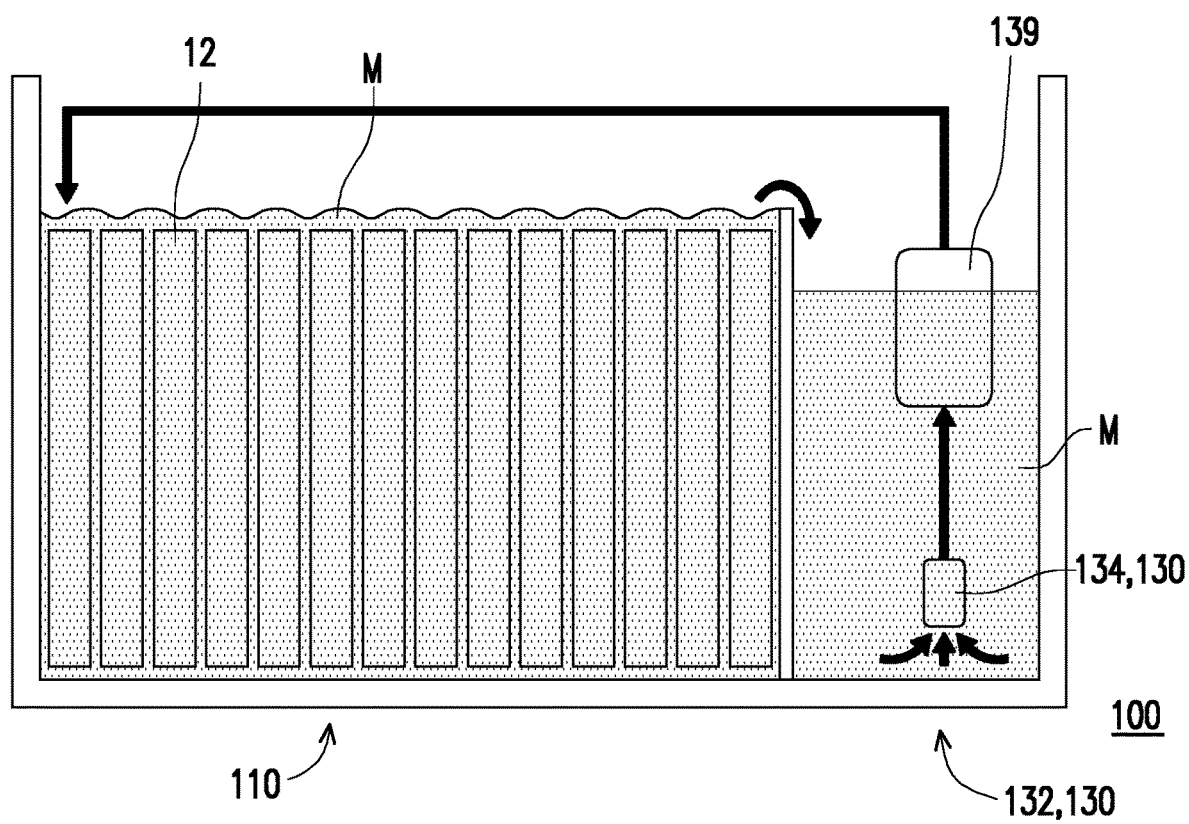
FIG. 2 is a schematic view of an immersion cooling system of FIG. 1.

FIG. 1 is a perspective view of part of the components of an electronic apparatus according to an embodiment of the disclosure. FIG. 2 is a schematic view of an immersion cooling system of FIG. 1. With reference to FIG. 1 and FIG. 2, an electronic apparatus 10 of the embodiment includes multiple heat generating components 12 (illustrated in FIG. 2) and an immersion cooling system 100. As shown in FIG. 1, the immersion cooling system 100 includes two main tanks 110 and a condensation structure 120. The main tanks 110 are adapted for containing a heat dissipation medium M (indicated in FIG. 2). The heat generating components 12 are disposed in the main tanks 110 to be immersed in the heat dissipation medium M. The liquid level of the heat dissipation medium M is, for example, controlled to be higher than the heat generating components 12 by 2 to 3 mm. The condensation structure 120 is disposed above the main tanks 110. In other embodiments, the number of the main tanks may be one or other appropriate numbers, and the disclosure is not limited thereto. For a clear presentation, FIG. 2 only illustrates one main tank 110.

In the embodiment, a cover may be used to cover the immersion cooling system 100 and seal the containing space of the immersion cooling system 100, allowing the heat dissipation medium M to perform the aforementioned circulation in the sealed containing space. Moreover, the cover may be opened to facilitate maintenance of the electronic apparatus 10 or disassembling and replacement of components.

The heat dissipation medium M is, for example, dielectric solution which is liquid at room temperature, such as fluorinated liquid with a boiling point between 40 and 60 degrees Celsius or other appropriate heat dissipation medium. The disclosure is not limited thereto. The liquid heat dissipation medium M absorbs the heat generated by a central processing unit or other type of chips on the heat generating components 12 (such as a motherboard in a server) to decrease the temperature of the heat generating components 12, and rapidly boils and vaporizes into a gaseous state with the heat generated by the heat generating components 12. When the heat dissipation medium M of high heat energy in the gaseous state flows to the condensation structure 120 in the sealed containing space, the temperature of the heat dissipation medium M is decreased by low-temperature condensate flowing in the condensation structure 120, which makes the heat dissipation medium M condense into liquid on the condensation structure 120. The condensate in the condensation structure 120 absorbs the heat energy from the heat dissipation medium M and flows out of the electronic apparatus 10 to be cooled by heat exchange, and the cooled condensate flows back to the condensation structure 120 to maintain continuous circulation. On the other hand, droplets of the heat dissipation M that condense on the condensation structure 120 fall back into the heat dissipation M in the liquid state in the main tank 110 by gravity, achieving the effect of heat dissipation with this circulation.

The electronic apparatus 10 of the embodiment further includes a liquid amount adjusting module 130. The liquid amount adjusting module 130 is configured to adjust the liquid level of the heat dissipation medium M in the main tank 110 and prevent the liquid level from being too high or too low. Therefore, the liquid amount adjusting module may be referred to as a liquid level adjusting module as well. The liquid amount adjusting module 130 of the embodiment is described below in details with drawings.

Figure 3:
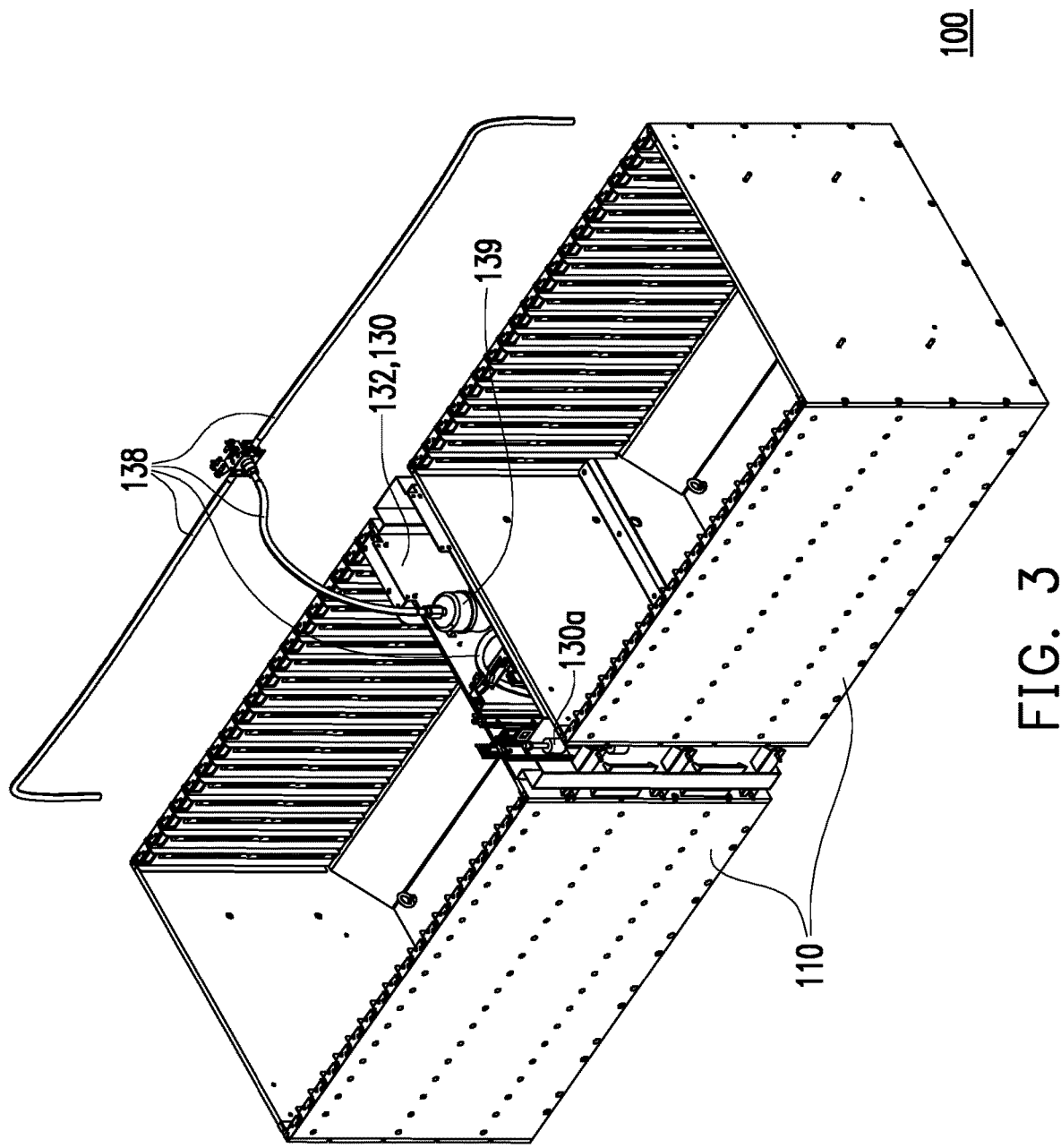
FIG. 3 is a perspective view of part of the components of the immersion cooling system of FIG. 1.
Figure 4:
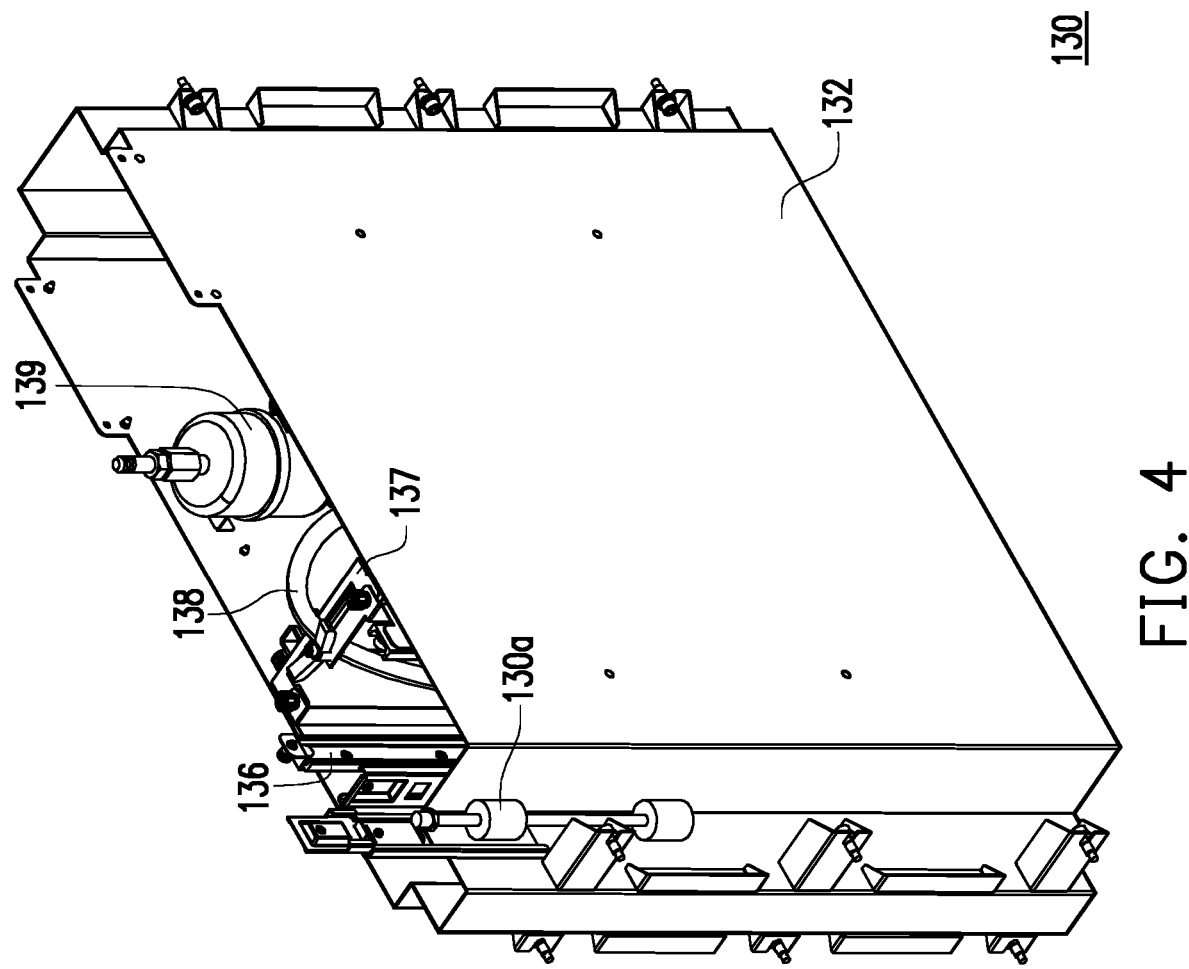
FIG. 4 is a perspective view of a liquid amount adjusting module of FIG. 3.
Figure 5:
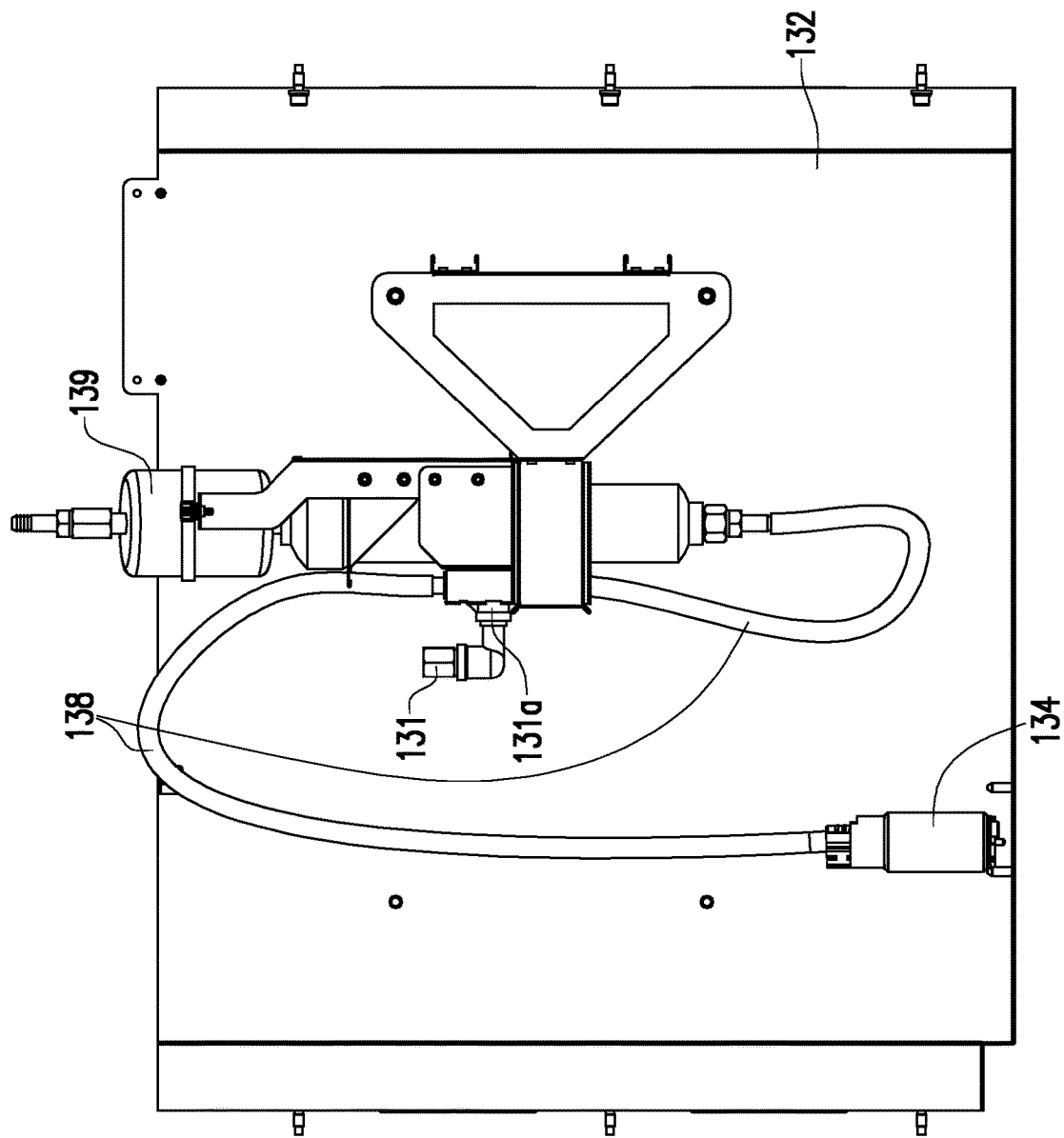
FIG. 5 is a side view of part of the components of the liquid amount adjusting module of FIG. 4.

FIG. 3 is a perspective view of part of the components of the immersion cooling system of FIG. 1. FIG. 4 is a perspective view of the liquid amount adjusting module of FIG. 3. FIG. 5 is a side view of part of the components of the liquid amount adjusting module of FIG. 4. With reference to FIG. 3 to FIG. 5, the liquid amount adjusting module 130 includes an auxiliary tank 132, a pump 134, and a pipeline 138. The auxiliary tank 132 is disposed between and adjacent to the two main tanks 110, allowing the heat dissipation medium M (indicated in FIG. 2) in each main tank 110 to be overflowed into the auxiliary tank 132. The auxiliary tank 132 is fixed between the two main tanks 110 by, for example, welding, locking or other appropriate methods. The pump 134 is disposed in the auxiliary tank 132. The pipeline 138 is connected to the pump 134 and extended toward the main tanks 110. The pump 134 is adapted to drive the heat dissipation medium in the auxiliary tank 132 to refill the main tanks 110 through the pipeline 138, in order to adjust the liquid level of the heat dissipation in the main tanks 110. In this way, when the liquid level of the heat dissipation medium is changed due to thermal expansion or contraction of the heat dissipation medium in the main tanks 110, diffusion of the heat dissipation medium in the main tanks 110, placement or removal of the heat generating components 12 (indicated in FIG. 2) in the main tanks 110, or other factors, the liquid amount adjusting module 130 may immediately adjust the amount of the heat dissipation medium in the main tanks 110 to a normal value, preventing the liquid level from being too high or too low.

In the embodiment, as described above, the auxiliary tank 132 is configured to adjust the amount of the heat dissipation medium M in the main tanks 110, instead of containing the heat generating components 12. Therefore, the capacity of the auxiliary tank 132 may be designed to be smaller than the capacity of the main tanks 110. Moreover, the capacity of the auxiliary tank 132 is, for example, designed to be not smaller than the volume of the heat generating components 12, in order to render the maximum amount of the heat dissipating medium M that can be contained in the auxiliary tank 132 sufficient to compensate for the amount of liquid level decrease caused by the removal of the heat generating components 12 from the main tanks 110. In addition, the ratio of thermal expansion or contraction of the heat dissipation medium M may also be used as a consideration factor in determining the capacity of the auxiliary tank 132, in order to ensure that the liquid amount adjusting module 130 can effectively adjust the amount of the heat dissipation medium in the main tanks 110 according to the amount of the heat dissipation medium in the auxiliary tank 132.

Figure 6A:
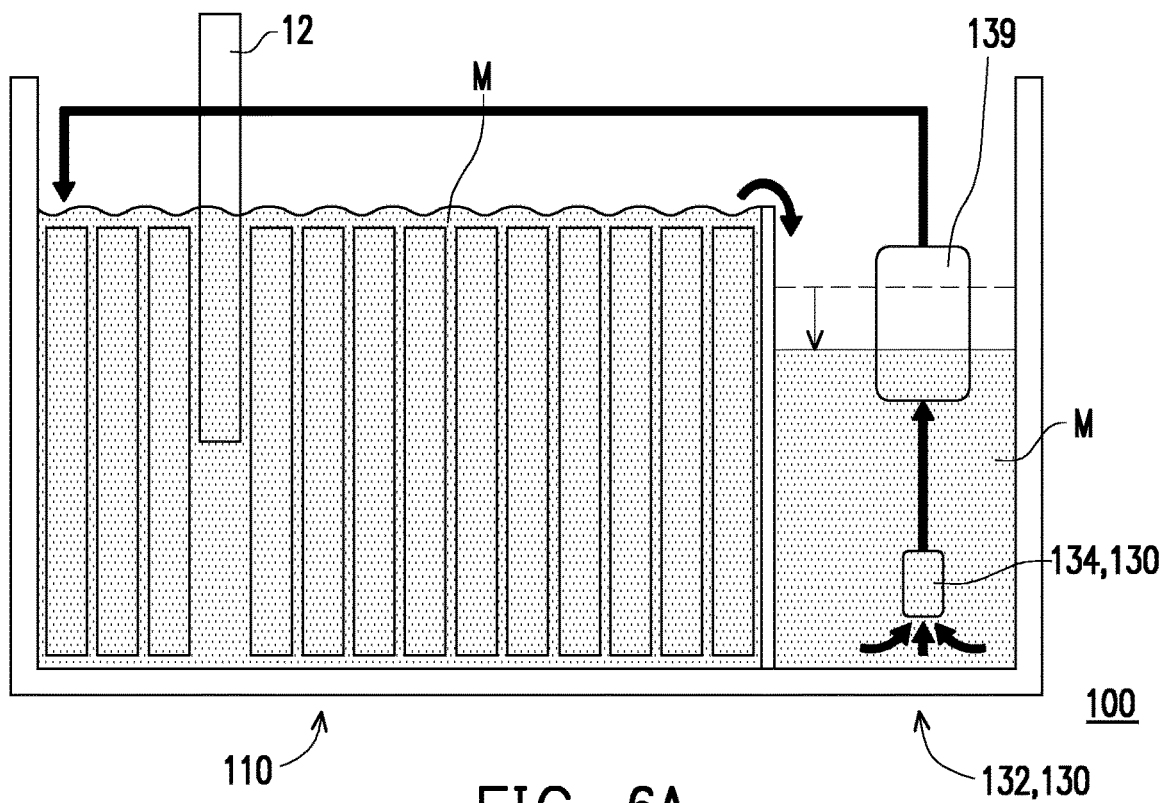
FIG. 6A to FIG. 6D illustrate adjustments to the liquid level of a heat dissipation medium in a main tank by the liquid amount adjusting module of FIG. 2.

FIG. 6A to FIG. 6D illustrate adjustments to the liquid level of the heat dissipation medium in the main tank by the liquid amount adjusting module of FIG. 2. Specifically, when one of the heat generating components 12 is taken out from the main tank 110 as shown in FIG. 6A, the pump 134 drives the heat dissipation medium M in the auxiliary tank 132 to flow into the main tank 110, preventing the liquid level of the heat dissipation medium M in the main tank 110 from decreasing due to the removal of the heat generating component 12. During the process, part of the heat dissipation medium M in the auxiliary tank 132 flows into the main tank 110 and thereby lowers the liquid level of the heat dissipation medium M in the auxiliary tank 132.

Figure 6B:
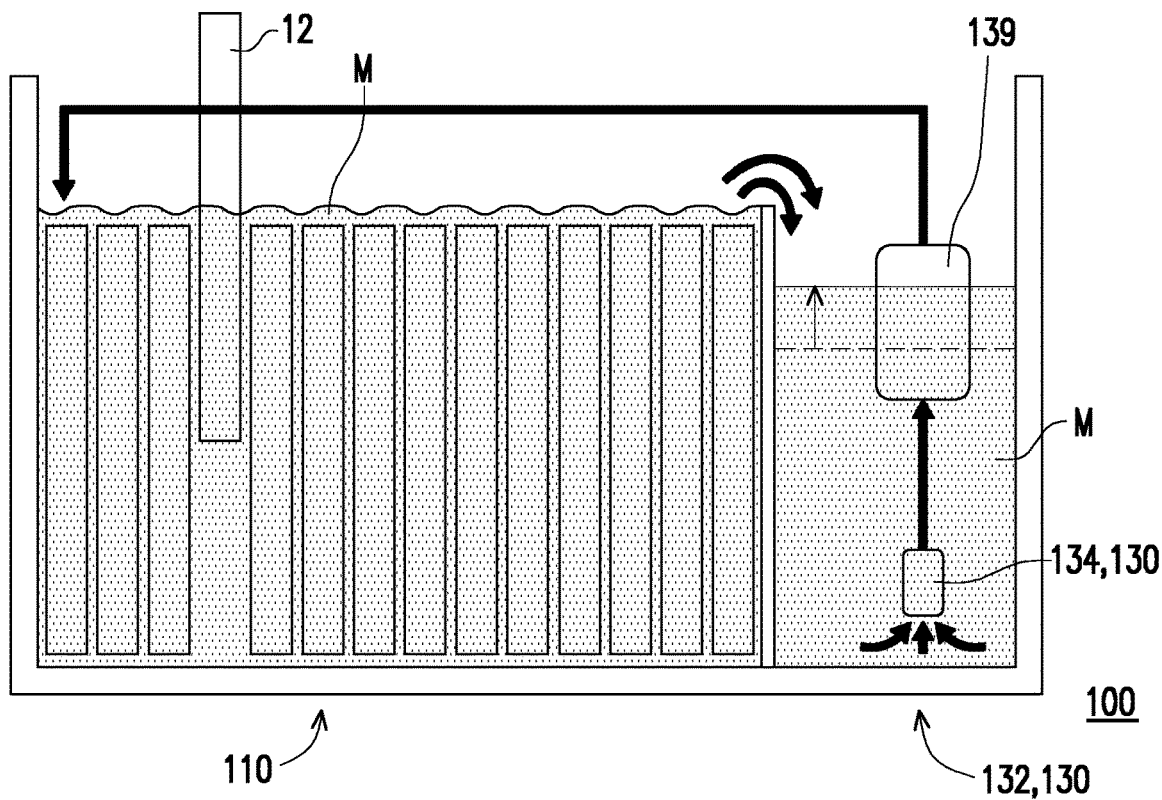

On the contrary, when one of the heat generating components 12 is placed in the main tank 110 as shown in FIG. 6B, the heat dissipation medium M in the main tank 110 is overflowed into the auxiliary tank 132 because the height of the side wall of the main tank 110 is only slightly higher than the top of the contained heat generating components 12 by approximately 2 to 3 mm, which prevents the liquid level of the heat dissipation medium M in the main tank 110 from increasing due to the placement of the heat generating component 12.

During the process, the increase of the amount of the heat dissipation medium M in the auxiliary tank 132 raises the liquid level of the heat dissipation medium M in the auxiliary tank 132.

Figure 6C:
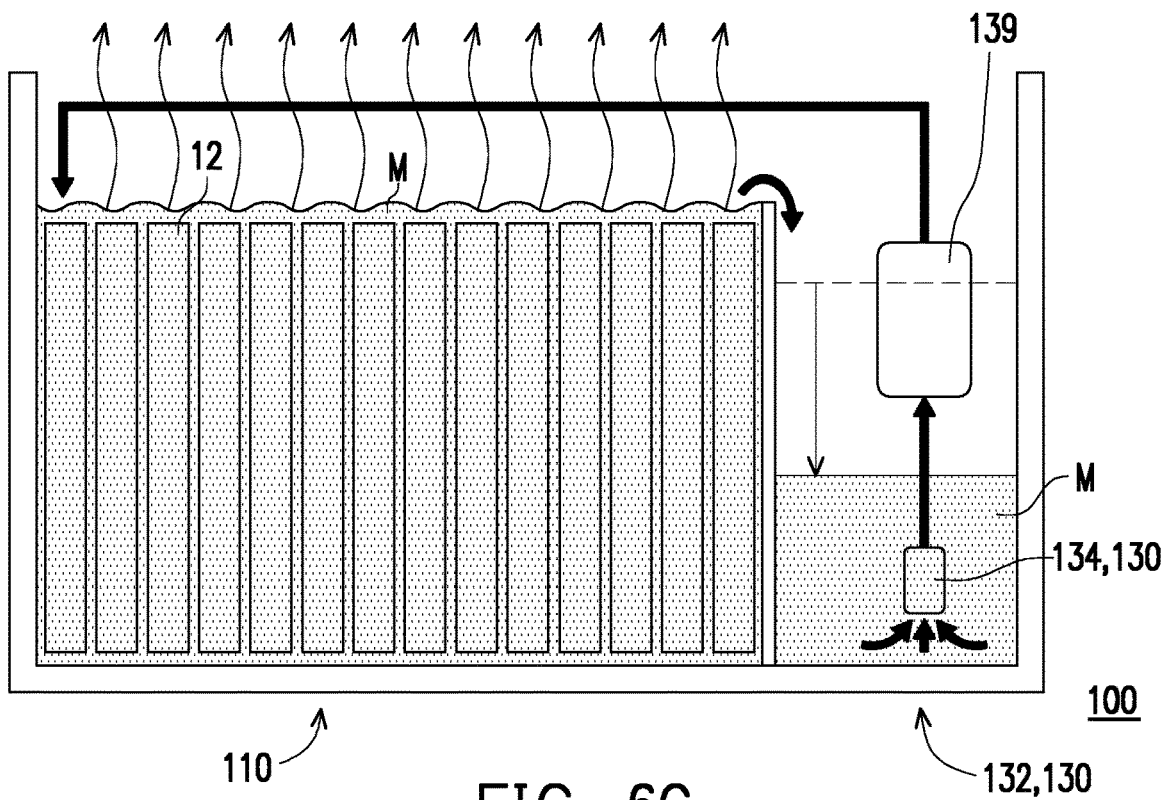

On the other hand, when the heat dissipation medium M in the main tank 110 effuses as shown in FIG. 6C, the pump 134 drives the heat dissipation medium M in the auxiliary tank 132 to flow into the main tank 110, preventing the liquid level of the heat dissipation medium M in the main tank 110 from decreasing due to the diffusion of the heat generating component 12. During the process, part of the heat dissipation medium M in the auxiliary tank 132 flows into the main tank 110 and thereby lowers the liquid level of the heat dissipation medium M in the auxiliary tank 132.

Figure 6D:
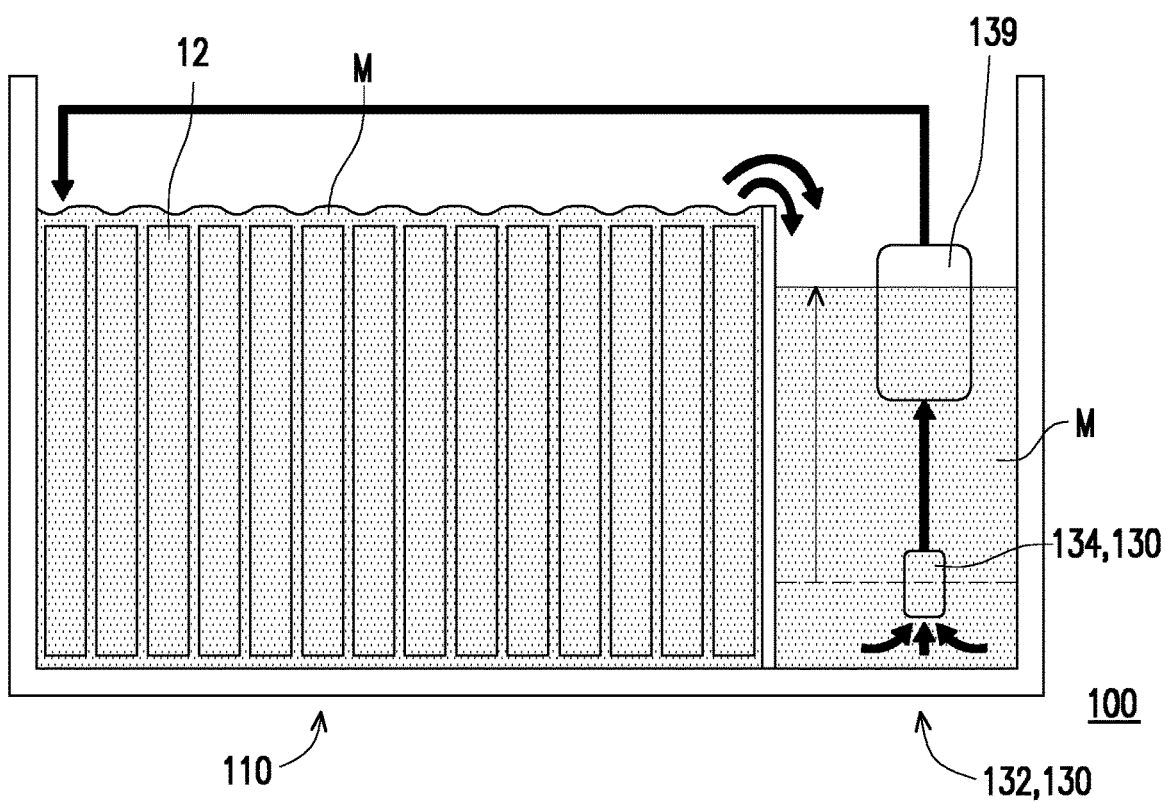

In addition, when the thermal expansion of the heat dissipation medium M in the main tank 110 occurs as shown in FIG. 6D, the heat dissipation medium M in the main tank 110 is overflowed into the auxiliary tank 132 because the height of the side wall of the main tank 110 is only slightly higher than the top of the contained heat generating components 12 by approximately 2 to 3 mm, which prevents the liquid level of the heat dissipation medium M from increasing due to the thermal expansion of the heat dissipation medium M. During the process, the increase of the amount of the heat dissipation medium M in the auxiliary tank 132 raises the liquid level of the heat dissipation medium M in the auxiliary tank 132.

As shown in FIG. 5 and FIG. 6A to FIG. 6D, the pump 134 of the embodiment is disposed at the bottom in the auxiliary tank 132. Because of the relatively low temperature of the heat dissipation medium M at the bottom in the auxiliary tank 132, the reduction of service life of the pump 134 disposed there due to high temperature may be prevented. The disposition method of the pump 134 of the embodiment is described below specifically with drawings.

Figure 8:
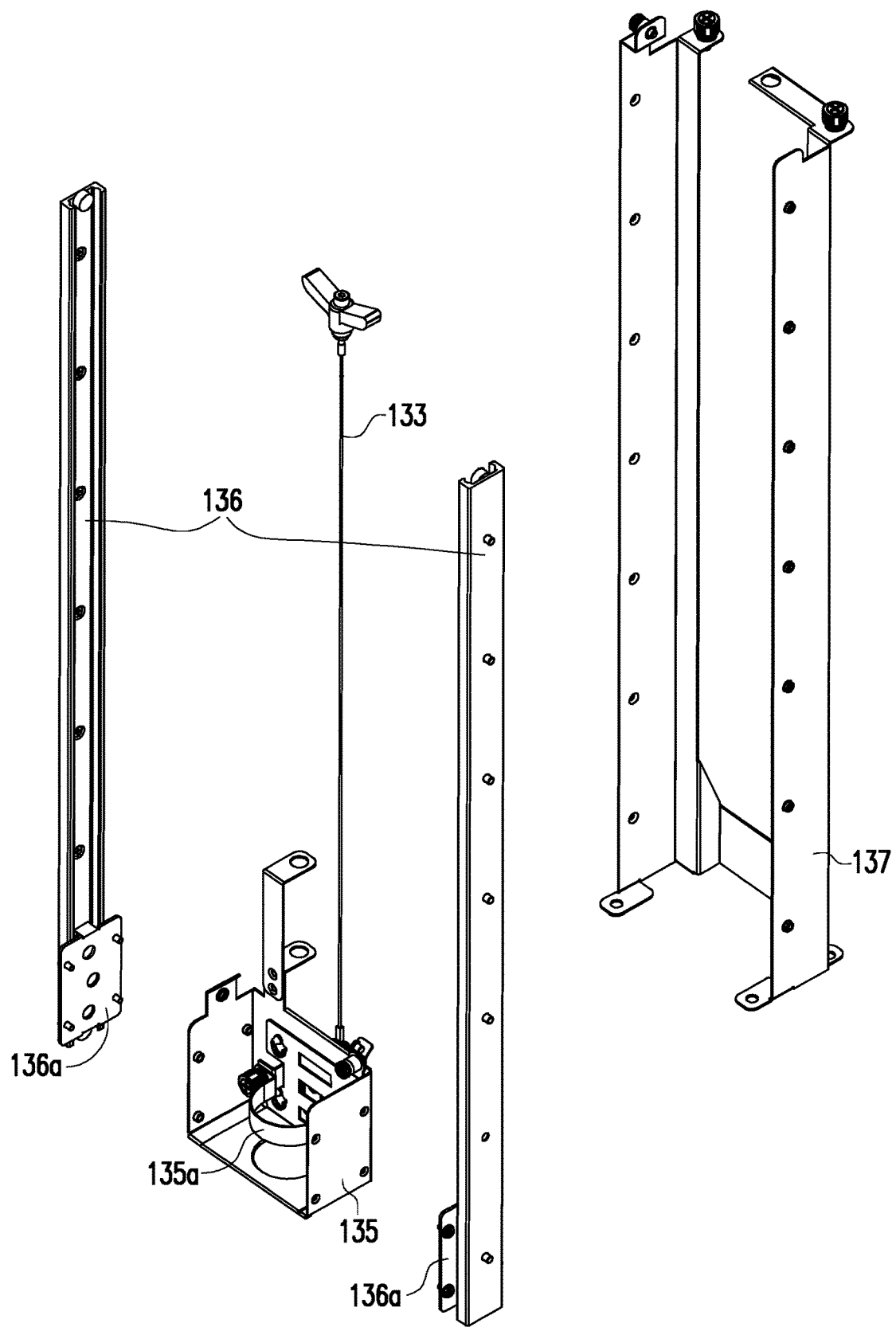
FIG. 8 is an exploded view of part of the components of the liquid amount adjusting module of FIG. 7.

FIG. 7 is an exploded view of part of the components of the liquid amount adjusting module of FIG. 4. FIG. 8 is an exploded view of part of the components of the liquid amount adjusting module of FIG. 7. With reference to FIG. 7 and FIG. 8, the liquid amount adjusting module 130 of the embodiment includes a guide rail 136. The guide rail 136 is disposed on a frame body 137 in the auxiliary tank 132. The pump 134 is connected to the guide rail 136 and adapted to move along the guide rail 136 toward the top of the auxiliary tank 132, in order to facilitate maintenance or replacement of the pump 134. Specifically, the pump 134 is installed at a fixing portion 135a of a bearer 135. The bearer 135 is installed at a sliding block 136a on the guide rail 136, which allows the bearer 135 and the pump 134 thereon to slide vertically along the guide rail 136 with the sliding block 136a. In addition, a cable 133 may be connected to the bearer 135 for users to pull the bearer 135 and the pump 134 thereon to the top of the auxiliary tank 132 with the cable 133. In other embodiments, the pump 134 may be installed in other appropriate methods, and the disclosure is not limited thereto.

The liquid amount adjusting module 130 of the embodiment further includes a filter 139. The filter 139 is connected to the pump 134 through the pipeline 138. The pump 134 is adapted to drive the heat dissipation medium M in the auxiliary tank 132 to flow into the main tank 110 through the filter 139. In this way, impurities in the heat dissipation medium M may be reduced effectively, in order to maintain the heat dissipation capacity of the heat dissipation medium M. In addition, the liquid amount adjusting module 130 of the embodiment as shown in FIG. 5 and FIG. 7 further includes a pressure gauge 131. The pressure gauge 131 is connected to the pump 134 through the pipeline 138 for measuring the pressure in the pipeline 138 and allowing users to know whether the pump 134 is operating normally. In the embodiment, the pressure gauge 131 is, for example, connected to the pipeline 138 between the pump 134 and the filter 139 through a T joint 131a (indicated in FIG. 5).

With reference to FIG. 4, the liquid amount adjusting module 130 of the embodiment further includes a liquid level sensor 130a. The liquid level sensor 130a is disposed at the auxiliary tank 132 and can sense the liquid level of the heat dissipation medium M in the auxiliary tank 132, determining whether the amount of heat dissipation medium M is sufficient accordingly. Therefore, there is no need to dispose any liquid level sensor in the main tank 110, so that it can be prevented that boiling and fluctuating of the heat dissipation medium M in the main tank 110 due to the high temperature of the heat generating components 12 from resulting in inaccurate liquid level sensing.

In summary, the disclosure adds the liquid amount adjusting module beside the main tanks of the immersion cooling system. The auxiliary tank of the liquid amount adjusting module may receive the heat dissipation medium overflowed from the main tanks, and the pump of the liquid amount adjusting module may drive the heat dissipation medium in the auxiliary tank to flow into the main tanks. In this way, when the liquid level of the heat dissipation medium is changed due to thermal expansion or contraction of the heat dissipation medium in the main tanks, diffusion of the heat dissipation medium in the main tanks, placement or removal of the heat generating components in the main tanks, or other factors, the liquid amount adjusting module may immediately adjust the amount of the heat dissipation medium in the main tanks to a normal value, preventing the liquid level from being too high or too low. In addition, because of the above addition of the liquid amount adjusting module, the filter and the liquid level sensor may be disposed at the liquid amount adjusting module, in order to filter impurities and sense the liquid level of the heat dissipation medium by using the filter and the liquid level sensor without occupying the internal space of the main tanks.

What is claimed is:

1. An electronic apparatus, comprising:
at least one heat generating component; and
an immersion cooling system, comprising:
a main tank, which is a single compartment tank that contains a heat dissipation medium, wherein the at least one heat generating component is disposed in the main tank and immersed in the heat dissipation medium; and
a liquid amount adjusting module, comprising an auxiliary tank, a liquid level sensor, a pipeline, and a pump, wherein the auxiliary tank is adjacent to the main tank, at least a portion of the heat dissipation medium flowing out of the main tank, apart from the rest portion of the heat dissipation medium continuously retained therein, is flowing through a top surface of a sidewall of the main tank and overflowed into the auxiliary tank,
wherein all flows of the heat dissipation medium out of the main tank unidirectionally flow along a path through the top surface of the sidewall of the main tank and towards the auxiliary tank,
wherein the pipeline is connected to the pump and extended toward the main tank, the pump is disposed in the auxiliary tank and drives the heat dissipation medium in the auxiliary tank to flow into the main tank through a passage of the pipeline, the liquid level sensor is disposed at the auxiliary tank, and a liquid level of the heat dissipation medium in the main tank is higher than a liquid level of the heat dissipation medium in the auxiliary tank.

2. The electronic apparatus according to claim 1, wherein a capacity of the auxiliary tank is smaller than a capacity of the main tank.

3. The electronic apparatus according to claim 1, wherein a capacity of the auxiliary tank is not smaller than a volume of the at least one heat generating component.

4. The electronic apparatus according to claim 1, wherein the pump is disposed at a bottom in the auxiliary tank.

5. The electronic apparatus according to claim 1, wherein the liquid amount adjusting module comprises a guide rail, the guide rail is disposed in the auxiliary tank, and the pump is connected to the guide rail and moves along the guide rail toward a top of the auxiliary tank.

6. The electronic apparatus according to claim 1, wherein the liquid amount adjusting module comprises a filter, the filter is connected to the pump, and the pump drives the heat dissipation medium in the auxiliary tank to flow into the main tank through the filter.

7. The electronic apparatus according to claim 1, wherein the liquid amount adjusting module comprises a pressure gauge, and the pressure gauge is connected to the pump.

8. The electronic apparatus according to claim 1, wherein the immersion cooling system comprises a condensation structure, the condensation structure is disposed above the main tank, the heat dissipation medium in a liquid state vaporizes into the heat dissipation medium in a gaseous state with a heat energy of the at least one heat generating component, the heat dissipation medium in the gaseous state condenses into the heat dissipation medium in the liquid state on the condensation structure when flowing to the condensation structure, and the heat dissipation medium in the liquid state which condenses on the condensation structure falls back into the heat dissipation medium in the liquid state in the main tank by gravity.

9. The electronic apparatus according to claim 1, wherein a height of a side wall of the main tank is higher than a top of the at least one heat generating components by 2 to 3 mm.

10. The electronic apparatus according to claim 1, wherein the heat dissipation medium in the main tank is exposed from a top opening thereof.

11. An immersion cooling system, comprising:
a main tank, which is a single compartment tank that contains a heat dissipation medium, wherein at least one heat generating component is disposed in the main tank and immersed in the heat dissipation medium; and
a liquid amount adjusting module, comprising an auxiliary tank, a liquid level sensor, a pipeline, and a pump, wherein the auxiliary tank is adjacent to the main tank, at least a portion of the heat dissipation medium flowing out of the main tank, apart from the rest portion of the heat dissipation medium continuously retained therein, is flowing through a top surface of a sidewall of the main tank and overflowed into the auxiliary tank,
wherein all flows of the heat dissipation medium out of the main tank unidirectionally flow along a path through the top surface of the sidewall of the main tank and towards the auxiliary tank,
wherein the pipeline is connected to the pump and extended toward the main tank, the pump is disposed in the auxiliary tank and drives the heat dissipation medium in the auxiliary tank to flow into the main tank through a passage of the pipeline, the liquid level sensor is disposed at the auxiliary tank, and a liquid level of the heat dissipation medium in the main tank is higher than a liquid level of the heat dissipation medium in the auxiliary tank.

12. The immersion cooling system according to claim 11, wherein a capacity of the auxiliary tank is smaller than a capacity of the main tank.

13. The immersion cooling system according to claim 11, wherein the pump is disposed at a bottom in the auxiliary tank.

14. The immersion cooling system according to claim 11, wherein the liquid amount adjusting module comprises a guide rail, the guide rail is disposed in the auxiliary tank, and the pump is connected to the guide rail and moves along the guide rail toward a top of the auxiliary tank.

15. The immersion cooling system according to claim 11, wherein the liquid amount adjusting module comprises a filter, the filter is connected to the pump, and the pump drives the heat dissipation medium in the auxiliary tank to flow into the main tank through the filter.

16. The immersion cooling system according to claim 11, wherein the liquid amount adjusting module comprises a pressure gauge, and the pressure gauge is connected to the pump.

17. The immersion cooling system according to claim 11, comprising a condensation structure, wherein the condensation structure is disposed above the main tank, the heat dissipation medium in a liquid state vaporizes into the heat dissipation medium in a gaseous state with a heat energy of the at least one heat generating component, the heat dissipation medium in the gaseous state condenses into the heat dissipation medium in the liquid state on the condensation structure when flowing to the condensation structure, and the heat dissipation medium in the liquid state which condenses on the condensation structure falls back into the heat dissipation medium in the liquid state in the main tank by gravity.

18. A liquid level adjusting module, adapted for an immersion cooling system, wherein the immersion cooling system comprises a main tank, which is a single compartment tank, the main tank contains a heat dissipation medium, and the liquid level adjusting module comprises:

an auxiliary tank, adjacent to the main tank, wherein at least a portion of the heat dissipation medium flowing out of the main tank, apart from the rest portion of the heat dissipation medium continuously retained therein, is flowing through a top surface of a sidewall of the main tank and overflowed into the auxiliary tank, wherein all flows of the heat dissipation medium out of the main tank unidirectionally flow along a path through the top surface of the sidewall of the main tank and towards the auxiliary tank;

a pump, disposed in the auxiliary tank, wherein the liquid level of the heat dissipation medium in the main tank is higher than a liquid level of the heat dissipation medium in the auxiliary tank;

a liquid level sensor, disposed at the auxiliary tank; and a pipeline, connected to the pump and extended toward the main tank, the pump drives the heat dissipation medium in the auxiliary tank to refill the main tank through a passage of the pipeline, in order to adjust a liquid level of the heat dissipation medium in the main tank.

19. The liquid level adjusting module according to claim 18, wherein the pump is disposed at a bottom in the auxiliary tank.

20. The liquid level adjusting module according to claim 18, comprising a guide rail, wherein the guide rail is disposed in the auxiliary tank and the pump is connected to the guide rail and moves along the guide rail toward a top of the auxiliary tank.

21. The liquid level adjusting module according to claim 18, comprising a filter, wherein the filter is connected to the pump, and the pump drives the heat dissipation medium in the auxiliary tank to flow into the main tank through the filter.

22. The liquid level adjusting module according to claim 18, comprising a pressure gauge, wherein the pressure gauge is connected to the pump.

23. The liquid level adjusting module according to claim 18, wherein the pump drives the heat dissipation medium in the auxiliary tank to refill the main tank through the pipeline.

* * * * *